United States Patent [19]

Kuo et al.

[11] Patent Number: 4,565,932
[45] Date of Patent: Jan. 21, 1986

[54] HIGH VOLTAGE CIRCUIT FOR USE IN PROGRAMMING MEMORY CIRCUITS (EEPROMS)

[75] Inventors: Clinton C. K. Kuo; Sam Dehganpour, both of Austin, Tex.

[73] Assignee: Motorola, Inc., Schaumburg, Ill.

[21] Appl. No.: 566,610

[22] Filed: Dec. 29, 1983

[51] Int. Cl.[4] .................... H03K 17/10; H03K 3/027; H03K 17/687; G11C 11/40
[52] U.S. Cl. .................... 307/264; 307/270; 307/279; 307/475; 365/185; 365/226; 365/104
[58] Field of Search ............... 307/501, 450, 571, 584, 307/473, 475, 228, 263, 530, 270; 328/181, 183, 185; 365/104, 184, 185, 226, 189

[56] References Cited

U.S. PATENT DOCUMENTS

| | | | |
|---|---|---|---|
| 4,101,788 | 7/1978 | Baker | 307/270 X |
| 4,121,203 | 10/1978 | Edward et al. | 307/270 X |
| 4,237,547 | 12/1980 | Smith | 365/104 X |
| 4,289,982 | 9/1981 | Smith | 365/104 X |
| 4,301,535 | 11/1981 | McKenney et al. | 307/475 X |
| 4,441,172 | 4/1984 | Ebel | 365/226 |
| 4,506,164 | 3/1985 | Higuchi | 307/585 X |
| 4,531,202 | 7/1985 | Watanabe | 365/226 X |

*Primary Examiner*—Stanley D. Miller
*Assistant Examiner*—David R. Bertelson
*Attorney, Agent, or Firm*—Anthony J. Sarli, Jr.; Jeffrey Van Myers; James L. Clingan, Jr.

[57] ABSTRACT

A high voltage circuit provides a high voltage signal output in response to receiving a logic signal. The high voltage circuit includes a regenerative circuit which is coupled to a high voltage terminal and a 5 volt power supply terminal. An inverting push-pull buffer responsive to the logic signal provides a signal which is regenerated to the high voltage by the regenerative circuit when the logic signal is in a first state and maintains the signal at ground potential when the logic signal is in a second logic state.

11 Claims, 2 Drawing Figures

HIGH VOLTAGE CIRCUIT FOR USE IN PROGRAMMING MEMORY CIRCUITS (EEPROMS)

TECHNICAL FIELD

This invention relates to high voltage circuits, and more particularly, to high voltage circuits controlled by a logic signal.

BACKGROUND ART

In electrically erasable programmable read only memories (EEPROMs) a high voltage is required to program and erase. The high voltage can be either externally applied or internally generated. An internally generated high voltage, although requiring more circuitry, is much more convenient for the end user. For such internally generated high voltage, the current capability is limited. The EEPROM cells do require some current, however, for programming. Consequently, efficient use of the high voltage power supply current under the control of a logic signal is required.

This typically has been done by using another pump circuit for each high voltage signal to be generated in conjunction with the high voltage separately generated. This requires a clock signal in addition to the control logic signal. Also, each pump circuit requires substantial chip area in order to obtain sufficient current.

SUMMARY OF THE INVENTION

An object of the present invention is to provide an improved high voltage circuit.

Another object of the invention is to provide a high voltage circuit with increased current capability.

Yet another object of the invention is to provide a high voltage circuit requiring less chip area.

These and other objects are achieved in a high voltage circuit which has first transistor and second transistors, and a load. The first transistor has a first current electrode coupled to a first power supply terminal, a control electrode for receiving an input signal, and a second current electrode. The load is coupled between an output node and the second current electrode of the first transistor. The second transistor has a first current electrode coupled to a high voltage power supply terminal, a second current electrode coupled to the second current electrode of the first power supply terminal, and a control electrode coupled to the output node.

DESCRIPTION OF THE INVENTION

Figure 1:
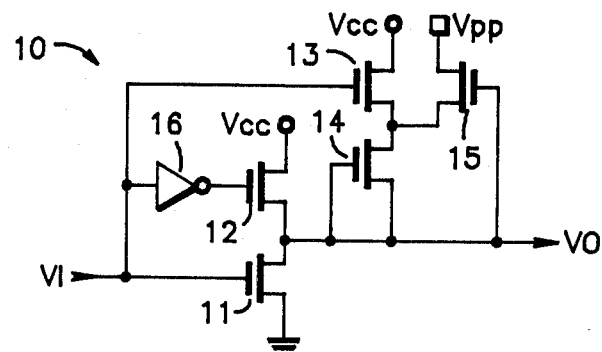
FIG. 1 is a circuit diagram of a high voltage circuit according to a preferred embodiment of the invention.

Shown in FIG. 1 is a high voltage circuit 10 comprised of a transistor 11, a transistor 12, a transistor 13, a transistor 14, a transistor 15, and an inverter 16. Transistors 11–15 are N channel insulated gate field effect transistors. Transistor 11 is preferably enhancement mode with a threshold voltage of 0.6 to 0.9 volt. Transistors 12 and 13 are preferrably natural, also called zero threshold devices, with a threshold voltage of 0 to 0.4 volt. Transistor 14 is preferably heavy depletion with a threshold voltage of 3.2 to −3.6 volts. Transistor 15 is preferably light depletion with a threshold voltage of −2.2 to −2.6 volts.

Transistor 11 has a gate for receiving a signal VI, a source connected to ground, and a drain for providing signal VO. Transistor 12 has a drain connected to a positive power supply terminal Vcc for receiving, for example, 5 volts, a source connected to the drain of transistor 11, and a gate. Inverter 16 has an input for receiving signal VI, and an output connected to the gate of transistor 12. Transistors 11 and 12 and inverter 16 together form an inverting push-pull buffer. Transistor 13 has a gate for receiving signal VI, a drain connected to Vcc, and a source. Transistor 14 has a drain connected to the source of transistor 13, and a gate and a source connected to the drain of transistor 11. Transistor 15 has a gate connected to the source and gate of transistor 14, a source connected to the drain of transistor 14, and a drain connected to a high voltage power supply terminal for receiving, for example, 18 volts.

When signal VI is a logic high, transistor 11 is conducting, causing signal VO to be a logic low at essentially ground potential. With signal VI at a logic high, transistor 13 is conducting so a positive voltage is generated on the source of transistor 13 and the drain of transistor 14 of sufficient magnitude to ensure that transistor 15 is not conducting. In view of transistor 15 being light depletion the lowest threshold voltage, highest in magnitude, it can have is −2.6 volts. Consequently transistor 15 will not be conducting so long as the voltage on its source exceeds the voltage on its gate by 2.6 volts. With transistor 14 having its gate and source connected together it acts as a load device so that with transistors 11 and 13 conducting there is a current path through transistors 13, 14 and 11. Transistor 11 is made of sufficiently high gain that signal VO will not exceed several tenths of a volt, for example 0.3 volt. With the gate of transistor 15 ensured of being at no more than 0.3 volt, transistor 15 is ensured of not conducting so long as its source exceeds 2.9 volts. Signal VI will typically be a buffered signal so that its voltage at a logic high will be known and is preferably very near the voltage at Vcc. When signal VI is at a logic high, transistor 15 is not conducting so that there is then no current drain on the high voltage power supply at Vpp. The only current drain is from Vcc which receives voltage from an external power supply. The current drain for such an external power supply is quite small.

When signal VI switches to a logic low, transistors 11 and 13 become non-conducting. Inverter 16 supplies a logic high to the gate of transistor 12 causing it to become conducting and cause signal VO to increase in voltage sufficiently to cause transistor 15 to become conducting. A regenerative process is thereby started. With transistor 15 conducting, the source of transistor 15 will increase to a voltage above that at its gate, which is then coupled back to the gate of transistor 15 via transistor 14 so that further voltage increases on the source of transistor 15 can occur with all such increases coupled back to the gate of transistor 15 via transistor 14. Such regenerative action continues until signal VO reaches the voltage at Vpp less the voltage drop through transistors 14 and 15 due to current flow therethrough. The gains of transistors 14 and 15 are chosen so that there is very little voltage drop due to the current flow. The output impedance of the high voltage power supply which supplies the voltage to Vpp is typically relatively large so that voltage reduction of signal VO due to current flow is caused mostly by the high output impedance of the power supply rather than the loading effect of transistors 14 and 15. The high voltage supply is assumed to be an internal supply which uses switching techniques to obtain a high voltage from 5 volts and as such has a limited current supplying capability. Although the gain of transistor 14 must be sufficiently large to prevent loading the power supply, the chip area required for high voltage circuit 10 is less than that required for a pump type circuit of comparable current carrying capability.

Figure 2:
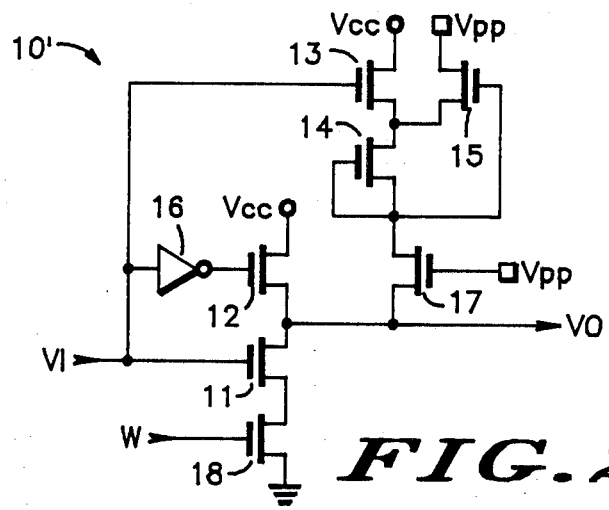
FIG. 2 is a circuit diagram of a high voltage circuit which includes a modification of the high voltage circuit of FIG. 1.

Shown in FIG. 2 is a high voltage circuit 10' which is the same as high voltage circuit 10 of FIG. 1, except that a transistor 17 is interposed between the drain of transistor 11 and the source and gate of transistor 14 and the gate of transistor 15, and a transistor 18 is interposed between the source of transistor 11 and ground. Transistor 17 has a gate connected to Vpp, a drain connected to the source and gate of transistor 14 and the gate of transistor 15, and a source connected to the drain of transistor 11. Transistor 18 has a drain connected to the source of transistor 11, a source connected to ground, and a gate for receiving a write signal W. Elements common to both FIG. 1 and FIG. 2 have the same numerals. Transistor 17, as is transistor 13, is a natural. Transistor 18, as is transistor 11, is an enhancement.

Transistor 17 is added to block current flow when the high voltage at Vpp is at ground potential. Because it is an internally generated voltage, it need not be generated at all times. There are times, such as a read mode of a memory, in which a high voltage is not required. During such a mode, power can be saved by not generating the high voltage. In such a read mode, Vpp at ground potential is used to advantage to make transistor 17 non-conducting. When signal VO is used for writing into an EEPROM cell, signal VO is coupled to the same line that is used for sensing data in the read mode. Consequently, in the read mode, it is necessary for circuit 10' to not interfere with the sensing of data. Transistor 17 effectively prevents transistors 13-15 from influencing such data sensing. Transistor 18 is conducting only when signal W is a logic high which is in the write mode. In the read mode signal W is a logic low so that transistor 18 is non-conducting. Transistor 18 thereby blocks a path to ground. Signal VI is ensured of being a logic high during the read mode. Consequently, inverter 16 provides a logic low to the gate of transistor 12, causing transistor 12 to be non-conducting. Consequently, circuit 10' does not influence the sensing of data during the read mode.

Circuit 10 of FIG. 1 provides a high voltage signal responsive to a 5 volt logic signal. Circuit 10' also provides a high voltage signal responsive to a 5 volt logic signal with the added feature of being useful for supplying the high voltage signal into an input/output node. Transistors 17 and 18 do not interfere with the normal operation of circuit 10'. When Vpp is at a high voltage, transistor 17 provides only negligible resistance between its source and drain so that the regenerative operation of transistors 14 and 15 results in the same voltage level for signal VO as that supplied by circuit 10 of FIG. 1. In the write mode transistor 18 receives a logic high on its gate causing it to be conductive. With transistor 18 conducting, transistor 11 responds in the same way as in circuit 10 of FIG. 1.

While the invention has been described in two embodiments, it will be apparent to those skilled in the art that the disclosed invention may be modified in numerous ways and assume many embodiments other than those specifically set out and described above. Accordingly, it is intended by the appended claims to cover all modifications of the invention which fall within the true spirit and scope of the invention.

We claim:

1. A high voltage circuit, comprising:
a first transistor having a control electrode for receiving an input signal, a first current electrode coupled to a first power supply terminal, and a second current electrode;
a load coupled between an output node and the second current electrode of the first transistor; and
a second transistor having a control electrode coupled to the output node, a first current electrode coupled to a high voltage power supply terminal, and a second current electrode coupled to the second current electrode of the first transistor.

2. The high voltage circuit of claim 1 further comprising an inverting push-pull buffer having an input for receiving the input signal, and an output coupled to the output node.

3. The high voltage circuit of claim 2 further comprising a third transistor, interposed between the output node and the load device and the control electrode of the second transistor, having a first current electrode coupled to the output node, a second current electrode coupled to the control electrode of the second transistor and the load device, and a control electrode coupled to the high voltage terminal.

4. The high voltage circuit of claim 3 wherein the inverting push-pull buffer comprises:
an inverter having an input for receiving the input signal, and an output;
a fourth transistor having a control electrode coupled to the output of the inverter, a first current electrode coupled to the first power supply terminal, and a second current electrode coupled to the output node; and a fifth transistor having a control electrode for receiving the input signal, a first current electrode coupled to the output node, and a second current electrode coupled to a second power supply terminal.

5. The high voltage circuit of claim 4 further comprising a sixth transistor, interposed between the second current electrode of the fifth transistor and the second power supply terminal, having a first current electrode coupled to the second current electrode of the fifth transistor, a second current electrode coupled to the second power supply terminal, and a control electrode for receiving a second input signal.

6. The high voltage circuit of claim 5 wherein the load comprises a seventh transistor having first current electrode coupled to the second current electrode of the first transistor, and a second current electrode and a control electrode coupled to the control electrode of the second transistor.

7. The high voltage circuit of claim 1 wherein the second transistor is a depletion transistor.

8. The circuit of claim 7 further comprising an inverting buffer having an input for receiving the input signal, and an output coupled to the output node.

9. The circuit of claim 8 wherein the load comprises a third transistor having a first current electrode coupled to the second current electrode of the first transistor, and a second current electrode and a control electrode coupled to the control electrode of the second transistor.

10. The circuit of claim 9 further comprising means for disabling the inverting buffer in response to a second input signal.

11. The high voltage circuit of claim 10 further comprising a fourth transistor, interposed between the output node and the second and control electrodes of the third transistor and the control electrode of the second transistor, having a first current electrode coupled to the output node, a second current electrode coupled to the second and control electrodes of the third transistor and the control electrode of the second transistor, and a control electrode coupled to the high voltage power supply terminal.

* * * * *